US 6,403,477 B1

(12) United States Patent
Tounai

(10) Patent No.: US 6,403,477 B1
(45) Date of Patent: Jun. 11, 2002

(54) METHOD FOR CORRECTING AN OPTICAL PROXIMITY EFFECT IN AN INTERCONNECT PATTERN BY SHORTENING THE LEGS OF CUTOUT PATTERNS TO AVOID LINEWIDTH REDUCTION

(75) Inventor: Keiichiro Tounai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/694,306

(22) Filed: Oct. 24, 2000

(30) Foreign Application Priority Data

Oct. 25, 1999 (JP) ............................................. 11-301875

(51) Int. Cl.⁷ ............................................. H01L 21/027
(52) U.S. Cl. ........................ 438/669; 438/618; 430/30; 430/311
(58) Field of Search ................................ 438/618, 669; 430/30, 311

(56) References Cited

U.S. PATENT DOCUMENTS 5,994,009 A * 11/1999 Tzu et al.
6,081,658 A * 6/2000 Rieger et al.
6,110,647 A * 8/2000 Inoue et al.
6,120,953 A * 9/2000 Lin .............................. 430/30
6,168,891 B1 * 1/2001 Shibata
6,238,824 B1 * 5/2001 Futrell et al.
6,303,251 B1 * 10/2001 Mukai et al. ................... 430/5
6,311,319 B1 * 10/2001 Tu et al. ........................ 716/19

FOREIGN PATENT DOCUMENTS

JP 58-200238 A * 11/1983
JP 10-229124 8/1998

* cited by examiner

Primary Examiner—Chandra Chaudhari
Assistant Examiner—Stephen W. Smoot
(74) Attorney, Agent, or Firm—McGinn & Gibb, PLLC

(57) ABSTRACT

A method for correcting an optical proximity effect in an exposure process includes the step of extracting corner portions of a mask interconnect pattern, providing a default "L"-shaped cutout correction pattern on the inner corner of the extracted corner portion, extracting a "]"-shaped pattern including a pair of corner portions in proximity, adjusting the distance of the opposing ends of the default cutout correction patterns in the "]"-shaped pattern to have a specified space. The method prevents the width of the straight portion of the "]"-shaped pattern of the resultant interconnect from being made smaller than the design width.

16 Claims, 12 Drawing Sheets

MASK PATTERN

PHOTORESIST PATTERN

MASK PATTERN

PHOTORESIST PATTERN

METHOD FOR CORRECTING AN OPTICAL PROXIMITY EFFECT IN AN INTERCONNECT PATTERN BY SHORTENING THE LEGS OF CUTOUT PATTERNS TO AVOID LINEWIDTH REDUCTION

BACKGROUND OF THE INVENTION (a) Field of the Invention

The present invention relates to a method for correcting an optical proximity effect and, more particularly, to an optical proximity effect correction method for correcting the shape of a corner portion of a mask interconnect pattern to be transferred onto a photoresist film by a photolithographic technique.

(b) Description of the Related Art

Along with reduction in design rule for semiconductor devices, patterns for forming the semiconductor devices, such as patterns for gate electrodes, interconnect layers and contact holes, have been more and more reduced in the dimensions thereof. Accordingly, mask patterns formed on an exposure mask, which are used for patterning the gate electrodes, interconnect layers and contact holes by photolithography, have also been more and more reduced in the dimensions thereof.

In an optical exposure in photolithography, When a mask pattern which has been reduced in dimensions to a degree close to the critical resolution of an exposure system is exposed and transferred onto a photoresist film, or the like, adjacent light beams optically interfere with each other during forming finely patterned regions which are in close proximity to each other. As a result, the exposed image is distorted. Thus, it is not possible to precisely transfer the mask pattern of the exposure mask. Generally, this is called an "optical proximity effect".

If an optical proximity effect occurs in the exposure transfer process, the design pattern cannot be precisely transferred onto the photoresist film by using the mask pattern, whereby it is not possible to obtain device characteristics as desired in the design stage of the semiconductor device.

In view of the above, the mask pattern is generally subjected to a correction for compensating for the optical proximity effect in order to suppress the optical proximity effect and thus to precisely transfer the mask pattern of the exposure mask onto the photoresist film.

Now, referring to some of attached drawings, the phenomenon of an optical proximity effect and a correction method therefor will be briefly described. FIGS. 1A and 1B are schematic diagrams respectively illustrating a mask interconnect pattern of an exposure mask, and an actual interconnect pattern which has been distorted by the optical proximity effect after exposing and transferring the mask interconnect pattern onto a photoresist film. FIGS. 2A and 2B are schematic diagrams respectively illustrating a mask interconnect pattern which has been corrected so as to compensate for the optical proximity effect, and an actual interconnect pattern obtained therefrom.

A desired design interconnect pattern, i.e., a mask interconnect pattern 11 of an exposure mask which is in a predetermined relationship with (e.g., in a constant dimensional proportion to) the desired design interconnect pattern, is an L-shaped pattern having a straight portion 12 and a corner portion 13 which is bent in a direction at 90° with respect to the straight portion 12, as illustrated in FIG. 1A, and the pattern is arranged so that the corner portion 13 of the interconnect pattern 11 is positioned above a contact hole 14. The outer corner located at the outer periphery of the corner portion 13 has a bend angle $\theta_1$ of 90° as measured from within the interconnect pattern 11, and is the inner corner located at the inner periphery of the corner portion 13 has a bend angle $\theta_2$ of 270°.

When the mask interconnect pattern 11 as illustrated in FIG. 1A is exposed and transferred onto the photoresist film, the interconnect pattern 16 obtained by the transfer process has round corners on the outer and inner peripheries of each of the corner portions 13. That is, each corner of the corner portion 13 is rounded by the optical proximity effect, as illustrated in FIG. 1B, thereby causing a deviation with respect to the contact hole 14. As a result, the contact area between the interconnect pattern 16 and the contact hole pattern 14 is reduced, whereby the contact resistance may increase and even a connection failure may occur therebetween.

In view of the above, a mask pattern having such a correcting pattern as to compensate for the optical proximity effect is used in the conventional technique in order to suppress the optical proximity effect.

For example, in Japanese Patent Laid-Open Publication No. Sho-10-229124, in order to suppress the above-described optical proximity effect, an additional correction pattern 17 or an "L"-shaped additional pattern is added to the outer corner of the corner portion 13 of the mask interconnect pattern 11, and a cutout correction pattern 18 or a "L"-shaped cutout pattern is provided on the inner corner of the corner portion 13.

By using such an exposure mask having a mask interconnect pattern for which the optical proximity effect has been corrected, it is possible to obtain a transferred interconnect pattern 19 close to the desired mask interconnect pattern 11, as illustrated in FIG. 2B.

The respective dimensions of the additional correction pattern and the cutout correction pattern which are provided in the mask pattern of the exposure mask in order to provide the correction of the optical proximity effect are determined by experiments, etc., for each of desired L-shaped interconnect patterns.

For example, as for the cutout correction pattern 20 provided on each inner corner of the corner portion 13 shown in FIG. 3, the cutout correction pattern 20 is generally an "L"-shaped pattern having two legs extending in two directions along the inner periphery of the corner portion 13. The two legs of the "L"-shaped pattern 20 meet each other at a right angle, and have a length of L and a width of W, as illustrated in FIG. 3.

The dimensions L and W of the cutout correction pattern are predetermined by experiments, etc., for each of the process conditions and the widths of the interconnects to be used, so as to eliminate the optical proximity effect as much as possible by providing a suitable correction. These dimensions are recited in a so-called "optical proximity effect correction rule".

An interconnect pattern provided in a semiconductor device is basically formed by an L-shaped pattern which includes a straight portion and a corner portion. An ordinary interconnect pattern has generally no outer corner or inner corner having a bend angle other than 90° and 270°. Thus, for the purpose of designing and fabricating semiconductor devices, it is practically correct that any outer corner formed at the outer periphery of the corner portion has a bend angle of 90° and an inner corner formed at the inner periphery of the corner portion has a bend angle of 270°.

Therefore, in the conventional technique, when providing an optical proximity effect correction for a mask interconnect pattern, a cutout correction pattern having predetermined dimensions was equally applied to the inner corner portion of the corner portion of L-shaped interconnect pattern with reference to the predefined optical proximity effect correction rule.

For example, when designing a mask interconnect pattern for representing a simulation design interconnect pattern 22 as illustrated in FIG. 4, the design interconnect pattern 22 is scanned along the layout of the design interconnect pattern. In this process, each time one of corner portions 23 to 31 is extracted, a cutout correction pattern and an additional correction pattern based on to the optical proximity effect correction rule is automatically and equally provided to the inner corner and the outer corner of the one of the extracted corner portions 23 to 31.

In FIG. 4, numeral 32 denotes a straight portion between adjacent corner portions 24 and 25, numeral 33 denotes a straight portion between adjacent corner portions 27 and 28, numeral 34 denotes a straight portion between adjacent corner portions 30 and 31, and numeral 35 denotes a diffused region. Each of the straight portion 32 between the corner portion 24 and the corner portion 25, the straight portion between the corner portion 26 and the corner portion 27, and the straight portion between the corner portion 28 and the corner portion 29 implements a gate electrode.

In the above-described conventional method in which an interconnect pattern is handled as a combination of L-shaped patterns or, in other words, in the optical proximity effect correction method in which an interconnect pattern is divided into L-shaped patterns, there are problems as described below. FIG. 5 shows a schematic interconnect pattern diagram illustrating the problems in the conventional optical proximity effect correction method.

A mask interconnect pattern has a "]"-shaped pattern. The "]"-shaped pattern as used in this text is also called a double-L pattern which includes two corner portions 37 and 38 opposing each other so that the inner corners (or the corners having a bend angle of 270°) of both the corner portions 37 and 38 oppose each other, and that the corner portions 37 and 38 forming the "]"-shaped pattern are disposed in close proximity to each other, with a gap therebetween below a specified threshold distance.

If a cutout correction pattern 39 is equally provided on the inner corner of each of the corner portions 37 and 38 of the double-L pattern 36 based on the optical proximity effect correction rule, the resultant interconnect pattern 40 of the mask obtained by using the cutout correction patterns 39 has a small distance "d" between opposing ends of the legs of adjacent L-shaped correction patterns, as illustrated in FIG. 5. In this case, the straight portion 41' of the exposed interconnect pattern indicated by dotted lines between the corner portions 37 and 38 has a significantly smaller width compared to the design width, thereby resulting in a locally increased resistance in the interconnect pattern 36.

Particularly, if the straight portion 41' implements a gate electrode 41 overlying a diffused region 42, as illustrated in FIG. 5, the gate electrode 41 has a length of $L_2$ which is smaller in length than the design gate length $L_1$. In the current semiconductor devices, the gate length has been more and more reduced, and the short channel effect of a transistor is sensitive to a slight difference in the gate length L. Thus, this may cause a significant problem that the transistor characteristics may significantly deviate from the design characteristics, whereby it is not possible to obtain a precise circuit operation as desired.

In the above-described example, if the cutout correction pattern 39 is not provided in the mask interconnect pattern 36 in the exposure mask, as illustrated in FIG. 6, the gate length of the straight portion 41' i.e., the gate electrode 41, has the desired gate length $L_1$. However, the end portion 43 of the gate electrode 41 has a larger width and thus the gate electrode has a larger length, thereby again deteriorating the transistor characteristics.

SUMMARY OF THE INVENTION

In view of the above, it is an object of the present invention to provide a method for correcting an optical proximity effect for correcting a mask pattern so that when forming an interconnect pattern having a "]"-shaped pattern or double-L pattern, the line width of the straight portion of an interconnect between the corner portions has a suitable width substantially equal to the design width.

The present invention provides a method for correcting an optical proximity effect in a photolithographic process for patterning an interconnect pattern by using a mask pattern having a mask interconnect pattern, the method comprising the steps of extracting corner portions in the mask interconnect pattern, providing a default cutout correction pattern having an "L"-shape on an inner corner of each of the extracted corner portions, calculating a first distance between opposing ends of legs of adjacent two of the default cutout correction patterns, comparing the first distance against a threshold distance, and modifying the default cutout correction patterns to obtain modified cutout pattern if the first distance is larger than the threshold distance so that a distance between opposing ends of legs of the modified cutout patterns is substantially equal to the threshold distance.

In accordance with the method of the present invention, the straight portion between the corner portions disposed in a close proximity is prevented from being made smaller than the design width due to the modified cutout correction patterns disposed on the inner corners of both the corner portions.

The above and other objects, features and advantages of the present invention will be more apparent from the following description, referring to the accompanying drawings.

DETAILED DESCRIPTION OF THE PREFERRED EMBODIMENTS

The present inventor studied in the conventional optical proximity effect correction method for a "]"-shaped pattern in an interconnect pattern to obtain the cause of the reduction in the line width of the straight portion of the interconnect pattern, and found that when the "L"-shaped cutout patterns for both the inner corners in the "]"-shaped pattern are disposed in a close proximity with each other, the line width of the straight portion is reduced.

Figure 5:
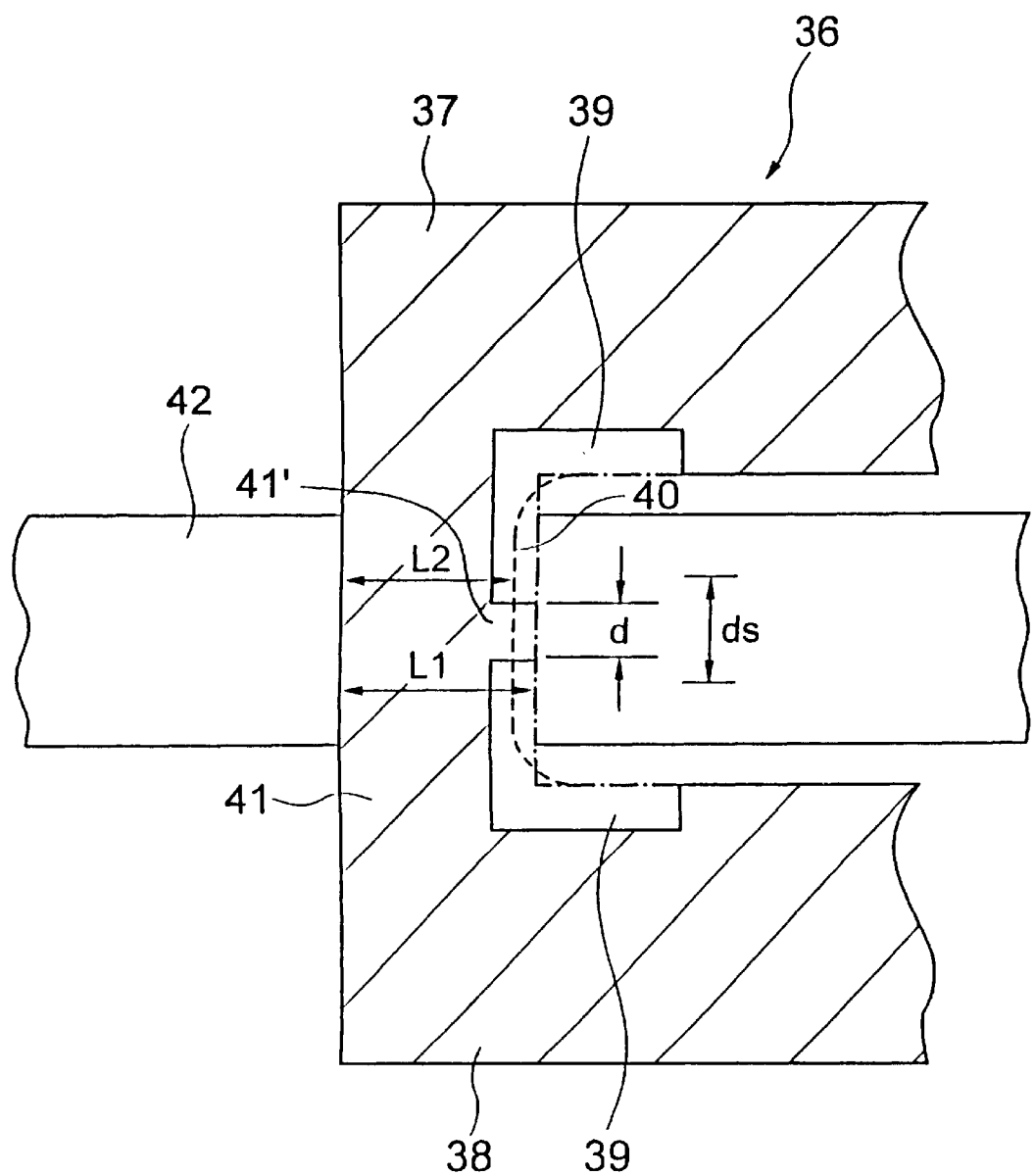
FIG. 5 shows the problem in a conventional optical proximity effect correction method.
Figure 6:
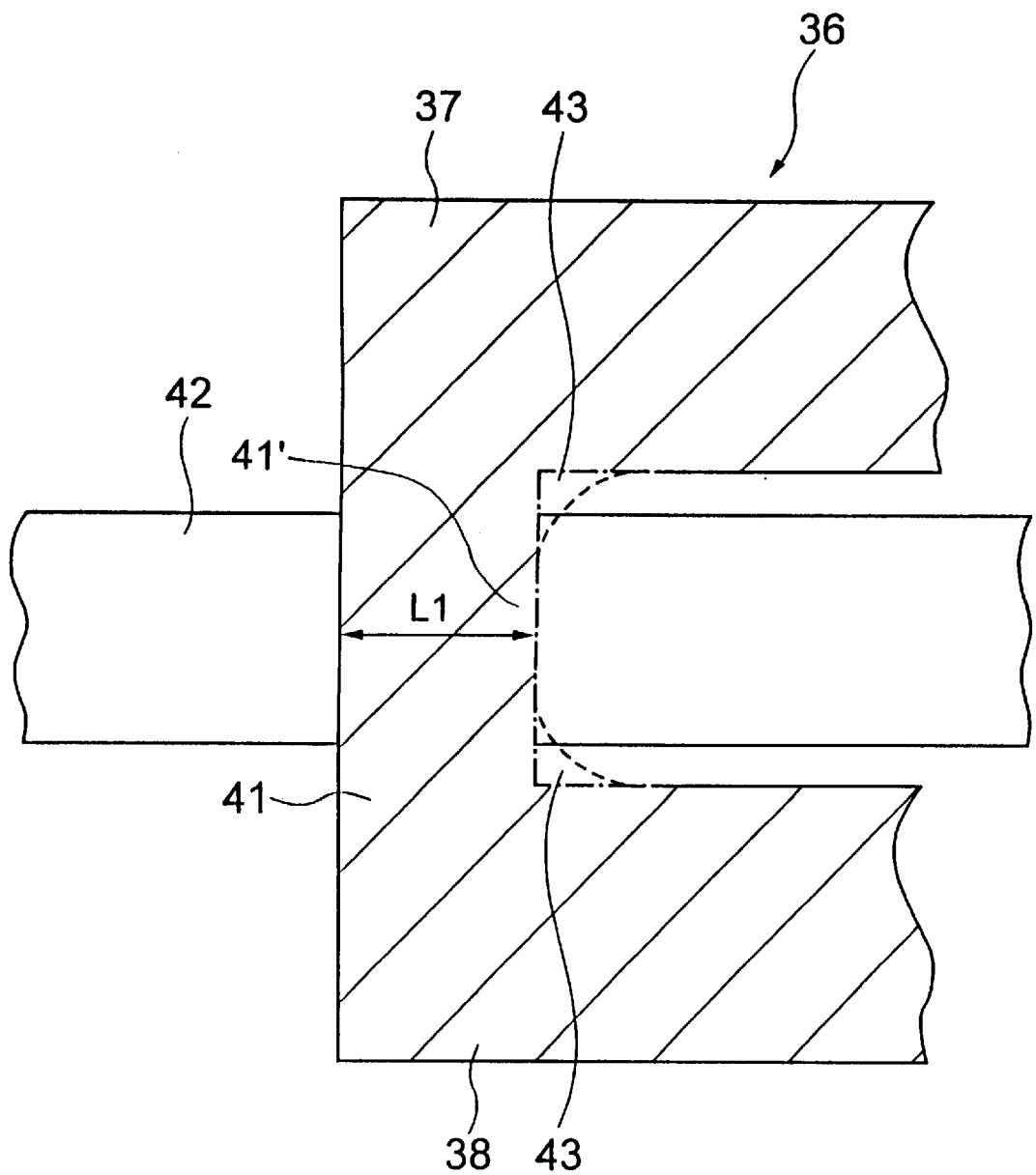
FIG. 6 shows the problem in the conventional optical proximity effect correction method in the case of the straight portion forming a gate electrode.

Thus, it was found that, if the distance "d" between the opposing ends of legs of "L"-shaped cutout patterns 39 used for correcting the "]"-shaped pattern shown in FIG. 5 is below a threshold "$d_s$", the opposing legs of both the "L"-shaped cutout patterns should be shortened so that the distance "d" therebetween is enlarged up to the threshold or specified distance "$d_s$". This provided in the experiments a suitable line width of the straight portion 41' of the interconnect pattern. Thus, if the straight portion implements a gate electrode, the specified distance "$d_s$" provided between the opposing ends of the "L"-shaped cutout patterns is effective for maintaining a design gate length.

Figure 1A:
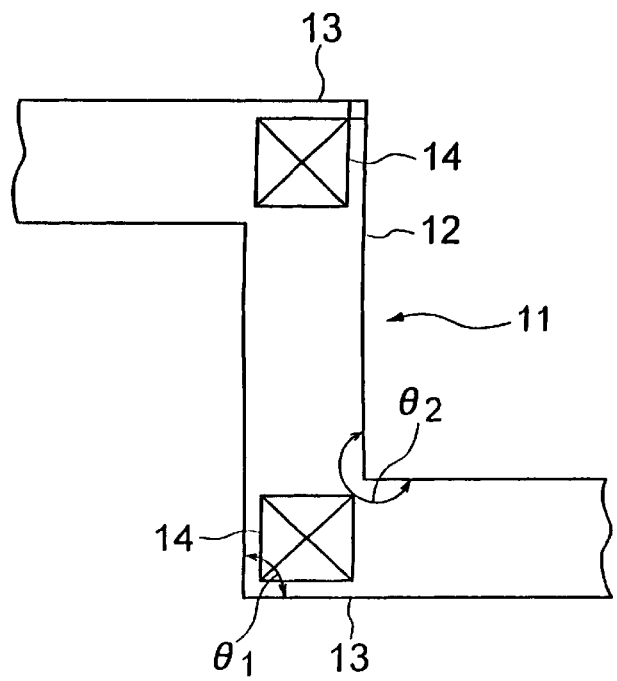
FIG. 1A shows a mask interconnect pattern.
Figure 1B:
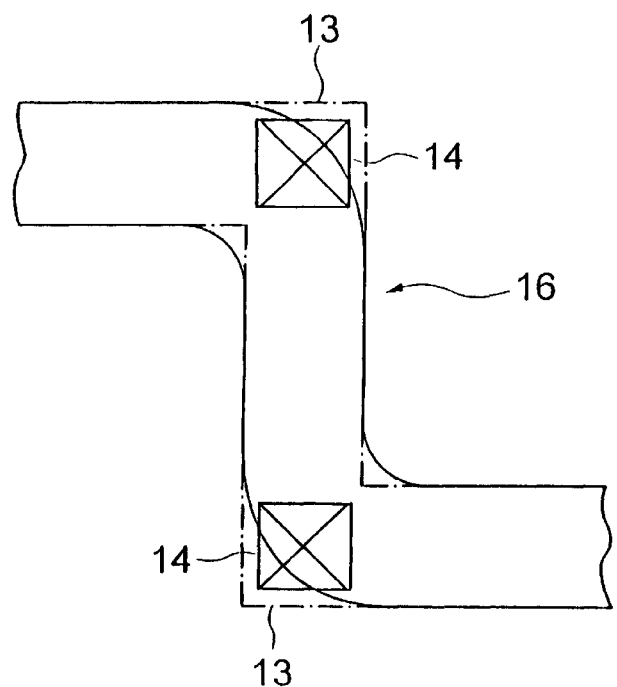
FIG. 1B shows an interconnect pattern formed by exposure through the mask interconnect pattern of FIG. 1A.
Figure 2A:
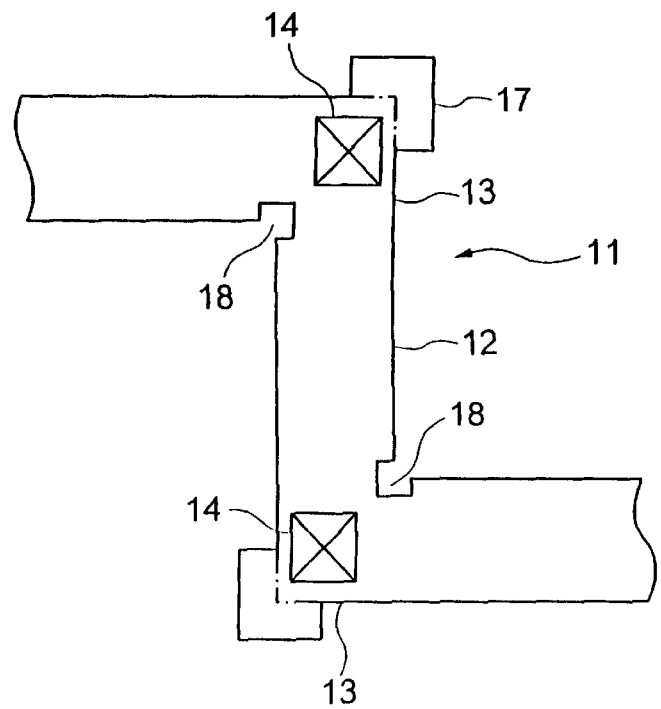
FIG. 2A shows a corrected mask interconnect pattern.
Figure 2B:
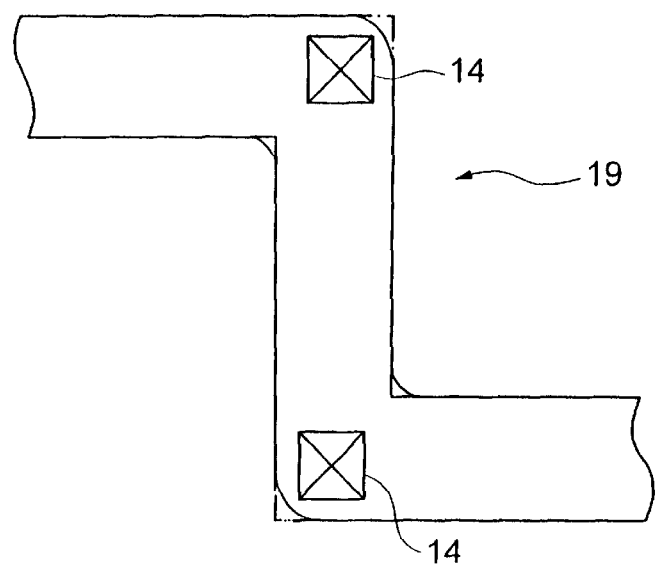
FIG. 2B shows an interconnect pattern formed by exposure through the corrected mask interconnect pattern of FIG. 2A.
Figure 3:
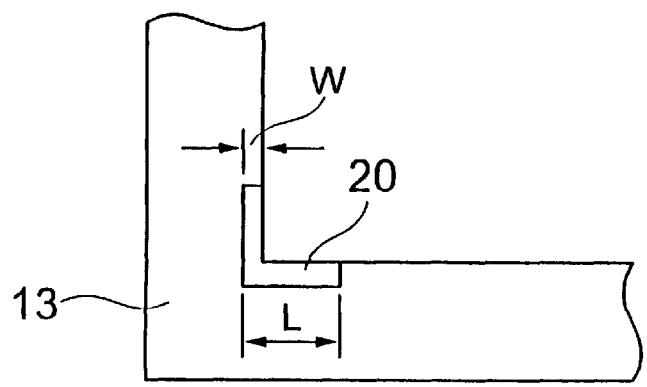
FIG. 3 shows a cutout correction pattern provided on an inner corner of the corner portion of a mask interconnect pattern.

In addition, if the corner portion 13 shown in FIG. 2A is associated with no contact hole pattern such as the contact hole pattern 14, the presence or absence of the additional correction pattern 17 on the outer corner of the corner portion 13 does not affect the electric characteristics of the interconnect pattern.

On the other hand, the structures for a "]"-shaped pattern implementing a gate electrode includes a first type and a second type.

The first type is such that the straight portion of the "]"-shaped pattern implements the gate electrode of a MOS transistor having source drain regions in a diffused region, as described above. In this case, the default cutout correction pattern should be corrected similarly to an ordinary interconnect pattern.

The second type is such that the straight portion of the interconnect pattern extends parallel to a diffused region for MOS transistors TR1 and TR2 over a specified distance with a specified gap therebetween, and that a pair of other straight lines extending from the corner portions extend across the diffused region to implement a pair of gate electrodes of transistors TR1 and TR2. In this case, it was confirmed that the default cutout correction patterns provided on the inner corners of the "]"-shaped pattern did not substantially affect the transistor characteristics of TR1 and TR2.

Now, embodiments of the present invention will be particularly and specifically described by way of examples with reference to the accompanying drawings.

Embodiment 1

Figure 7:
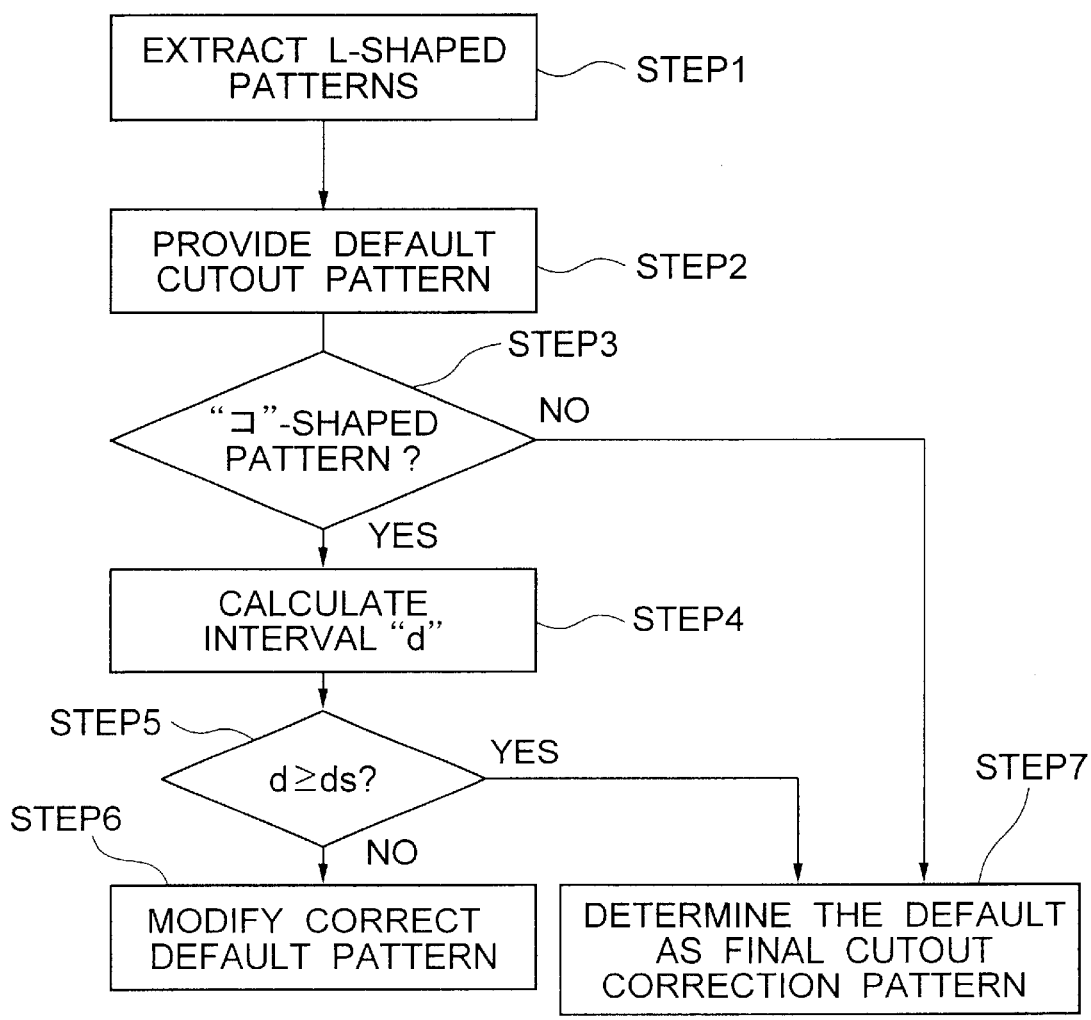
FIG. 7 is a flowchart of a method according to a first embodiment of the present invention.
Figure 8:
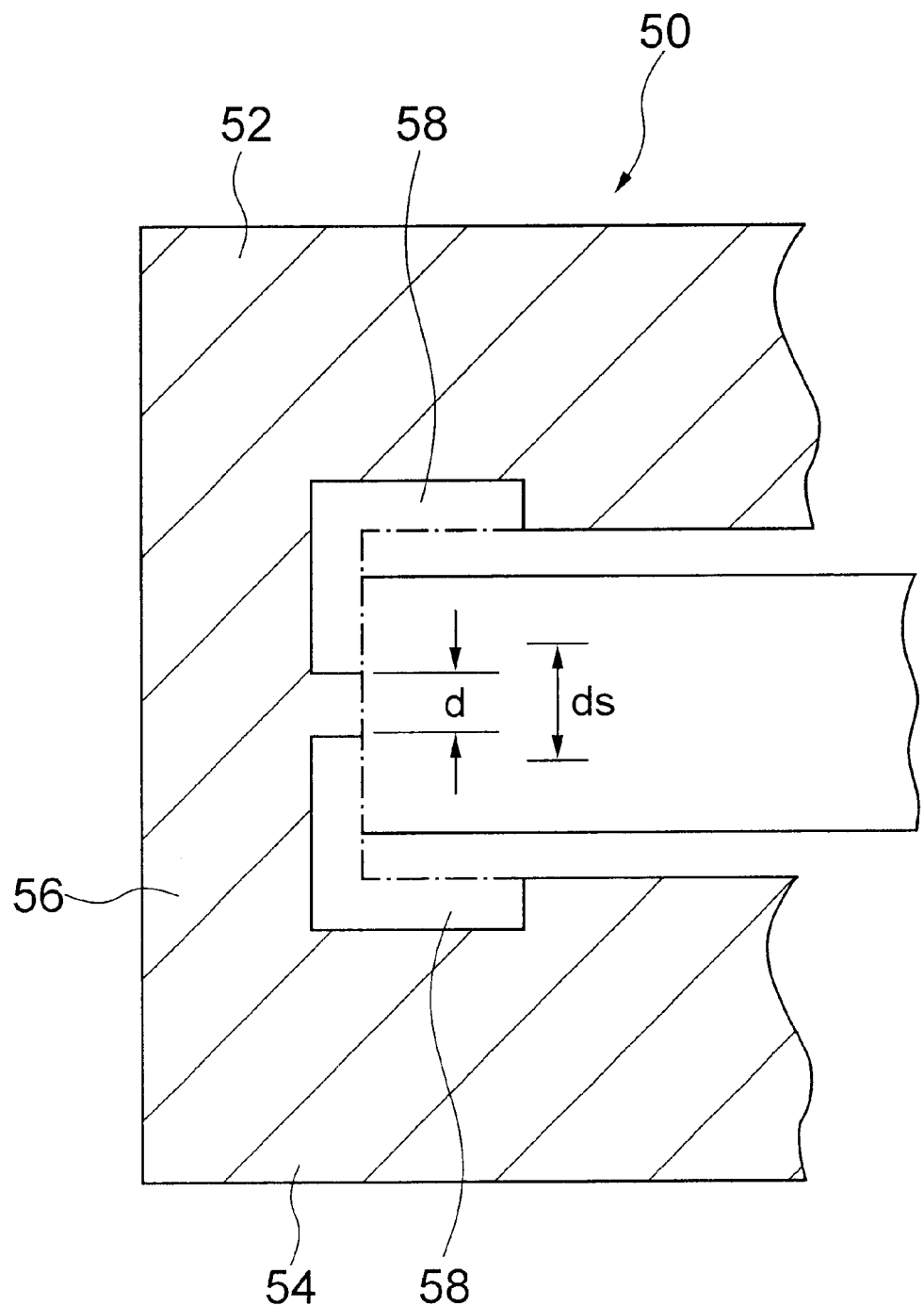
FIG. 8 shows a "]"-shaped pattern provided with default cutout correction patterns based on the method of FIG. 7.
Figure 9:
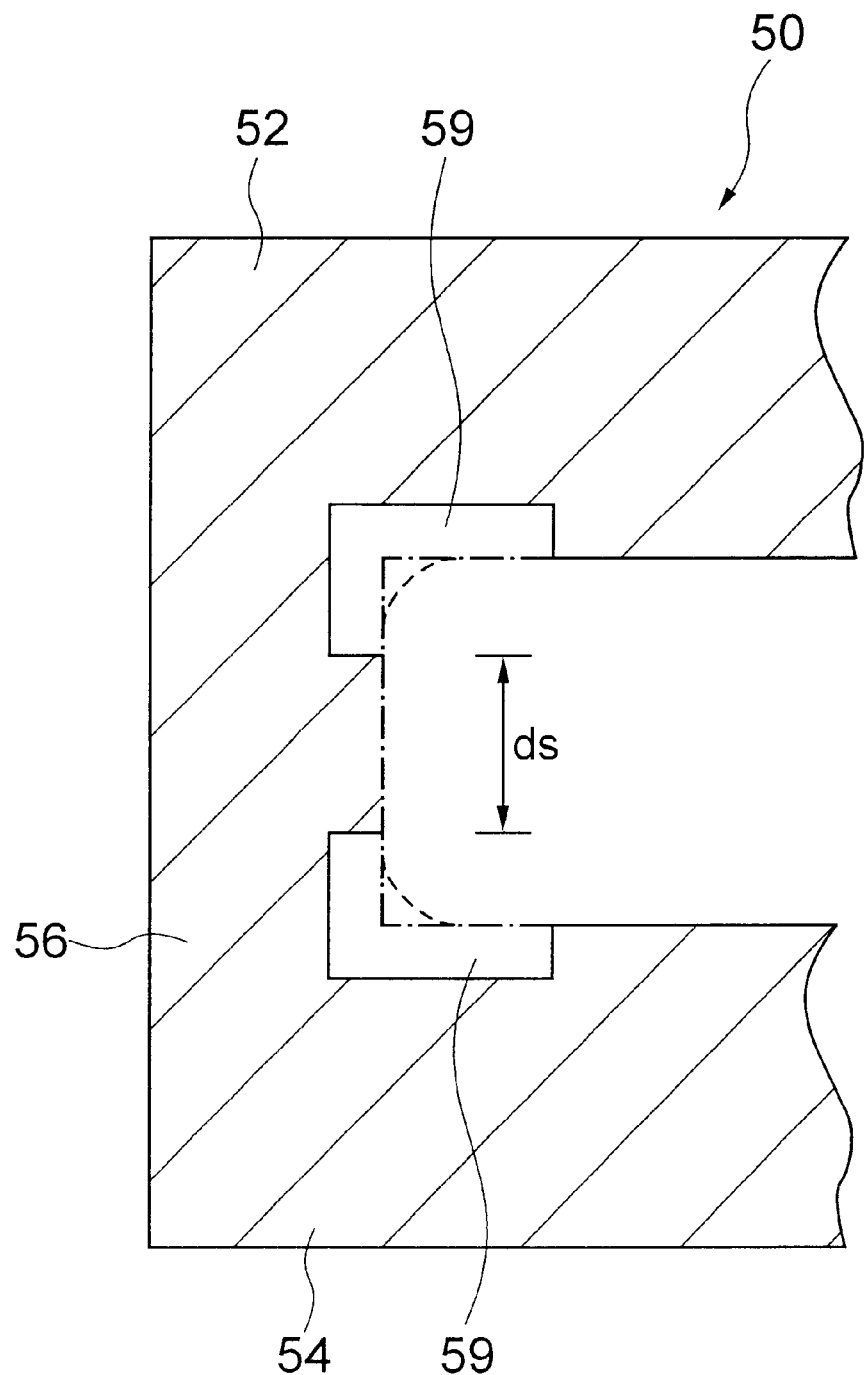
FIG. 9 shows a "]"-shaped pattern provided with modified cutout correction patterns based on the method of FIG. 7.

The embodiment described below is an exemplary embodiment of an optical proximity effect correction method according to the first method of the present invention. FIG. 7 is a flowchart illustrating the procedure of performing the optical proximity effect correction method of the present embodiment, FIG. 8 is a pattern diagram illustrating a default cutout correction pattern provided on each of the inner corners of a "]"-shaped pattern, and FIG. 9 is a pattern diagram illustrating modified cutout correction patterns disposed on each of the inner corners of the "]"-shaped pattern and each having a shortened (small-length) leg opposing the leg of the other of the cutout correction patterns.

The method of the present embodiment is directed to an optical proximity effect correction method which is used to correct a mask interconnect pattern of an exposure mask in the case other than the straight portion implementing a gate electrode of a MOS transistor.

Figure 4:
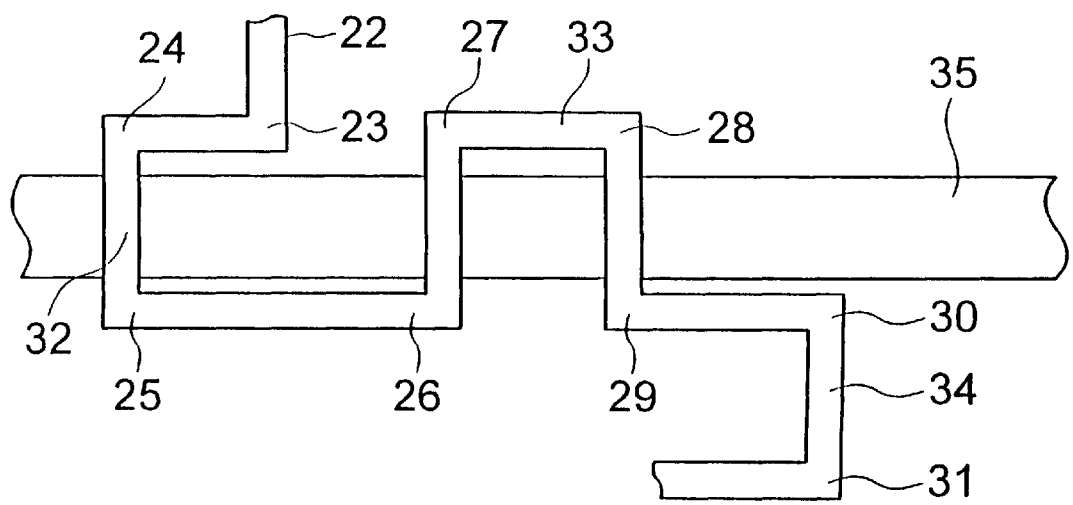
FIG. 4 is a top plan view of an exemplified design interconnect pattern.

With reference to FIG. 7, the procedure of the method of the present embodiment will be described. First, in step 1, the design interconnect pattern 22 as illustrated in FIG. 4 is scanned to extract L-shaped patterns each including a corner portion and two straight portions extending therefrom in an L-shaped configuration, and the process advances to step 2. In the design interconnect pattern 22, reference numerals 23 to 31 denote corner portions forming L-shaped patterns. In the present embodiment, it is assumed that no diffused region 35 is provided in the vicinity of the "L"-shaped pattern.

In step 2, on the inner corner (the corner having a bend angle of 270°) of each corner portion of an L-shaped pattern of a mask interconnect pattern corresponding to the L-shaped pattern of the design interconnect pattern 22, a predetermined (default) cutout correction pattern is provided to each of the corner portions in accordance with the L-shaped pattern optical proximity effect correction rule.

For example, on the inner corner of each of corner portions 52 and 54 of a mask interconnect pattern 50 respectively corresponding to the corner portions 30 and 31 of the design interconnect pattern 22, a default cutout correction pattern 58 is equally provided, as illustrated in FIG. 8, based on an L-shaped pattern optical proximity effect correction rule.

In step 3, it is determined whether or not two adjacent ones of the L-shaped patterns, which have been extracted in step 1, in combination form a "]"-shaped pattern. If yes, the process advances to step 4 and, otherwise, to step 7.

The "]"-shaped pattern refers to, for example, a portion of the interconnect pattern shown in FIG. 4, which includes the corner portions 30 and 31, the straight portion connecting the corner portion 29 and the corner portion 30 together, the straight portion 34 connecting the corner portions 30 and 31 together, and the straight portion extending from the corner portion 31. Hereinafter, for the purpose of exemplification, the "]"-shaped pattern including the corner portions 30 and 31 and the straight portion 34 is described as a typical "]"-shaped pattern.

In step 4, the distance or interval between the opposing ends of the legs of the adjacent default cutout correction patterns provided in a mask interconnect pattern corresponding to the "]"-shaped pattern including the corner portions 30 and 31 and the straight portion 34 is calculated, and the process advances to step 5.

In other words, the interval "d" (see FIG. 8) between the opposing ends of both the default cutout correction patterns 58 which are respectively provided on the inner corners of the adjacent corner portions 52 and 54 is calculated, and the process advances to step 5.

In step 5, the calculated interval "d" between the opposing ends is compared against the predetermined setting interval $d_S$ (see FIG. 8). If the calculated interval "d" between the opposing ends is less than the predetermined setting interval "$d_S$", the process advances to step 6. If the calculated interval "d" between the opposing ends is equal to or greater than the predetermined setting interval "$d_S$", the process advances to step 7.

In step 6, a modified cutout correction pattern 59, which is obtained by shortening the length of the default cutout correction pattern along the straight portion 56 of the interconnect pattern 50 so that the interval "d" between the opposing ends of both the cutout correction patterns is equal to the setting interval "$d_S$", is provided on the inner corner of each of the two corner portions 52 and 54 of the mask interconnect pattern 50, as illustrated in FIG. 9.

In this way, in the end portions of the straight portion 56, i.e., the portion connecting the corner portions 52 and 54 together, of the interconnect pattern obtained by an exposure, the line width of the straight portion is not reduced, as indicated by a broken line in FIG. 8.

In step 7, the default cutout correction pattern 58 provided in step 2 is used as the final cutout correction pattern.

The present embodiment is especially effective in the semiconductor device wherein the circuit characteristics are sensitive to the interconnect resistance.

Embodiment 2

Figure 10:
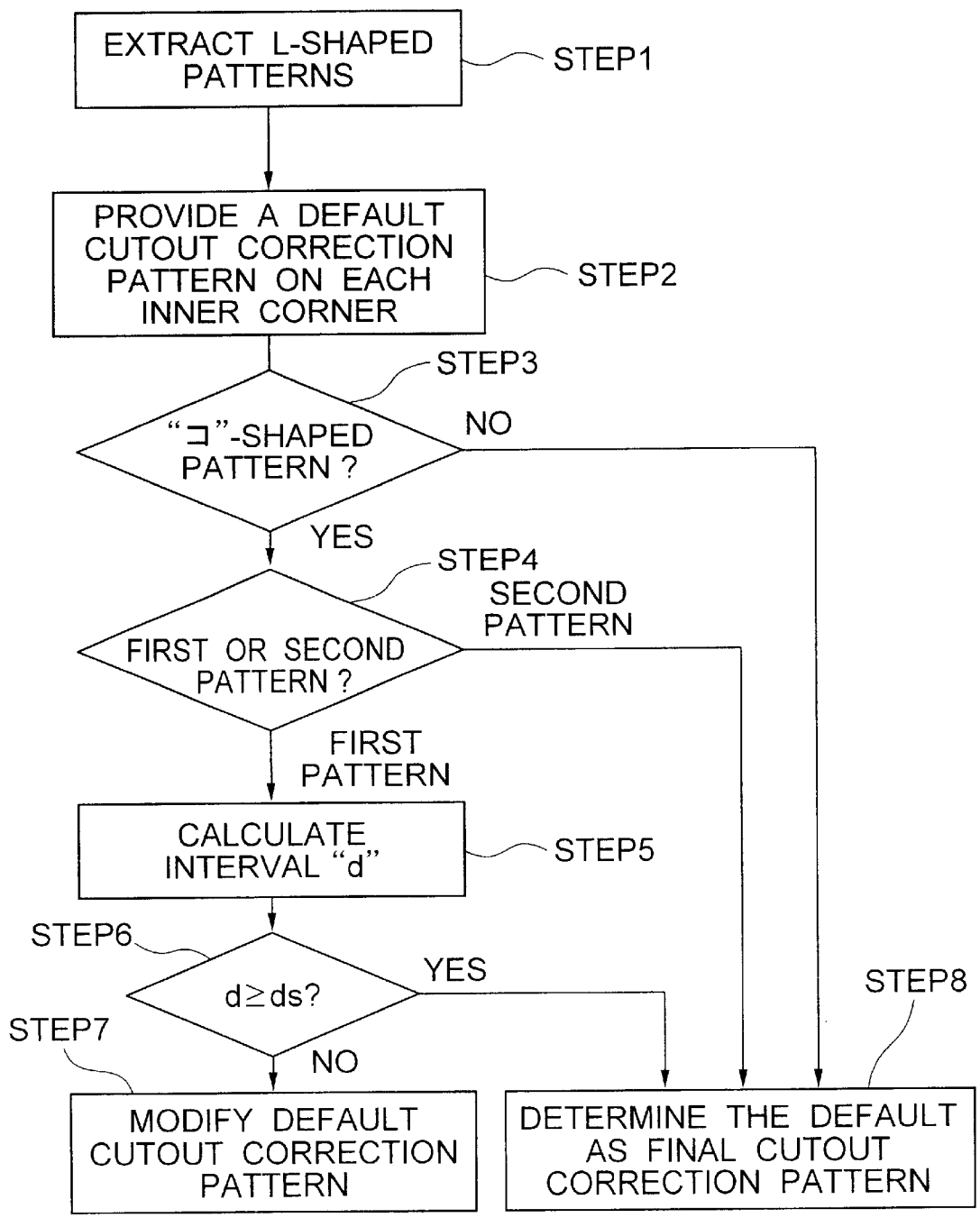
FIG. 10 is a flowchart of a method according to a second embodiment of the present invention.
Figure 11:
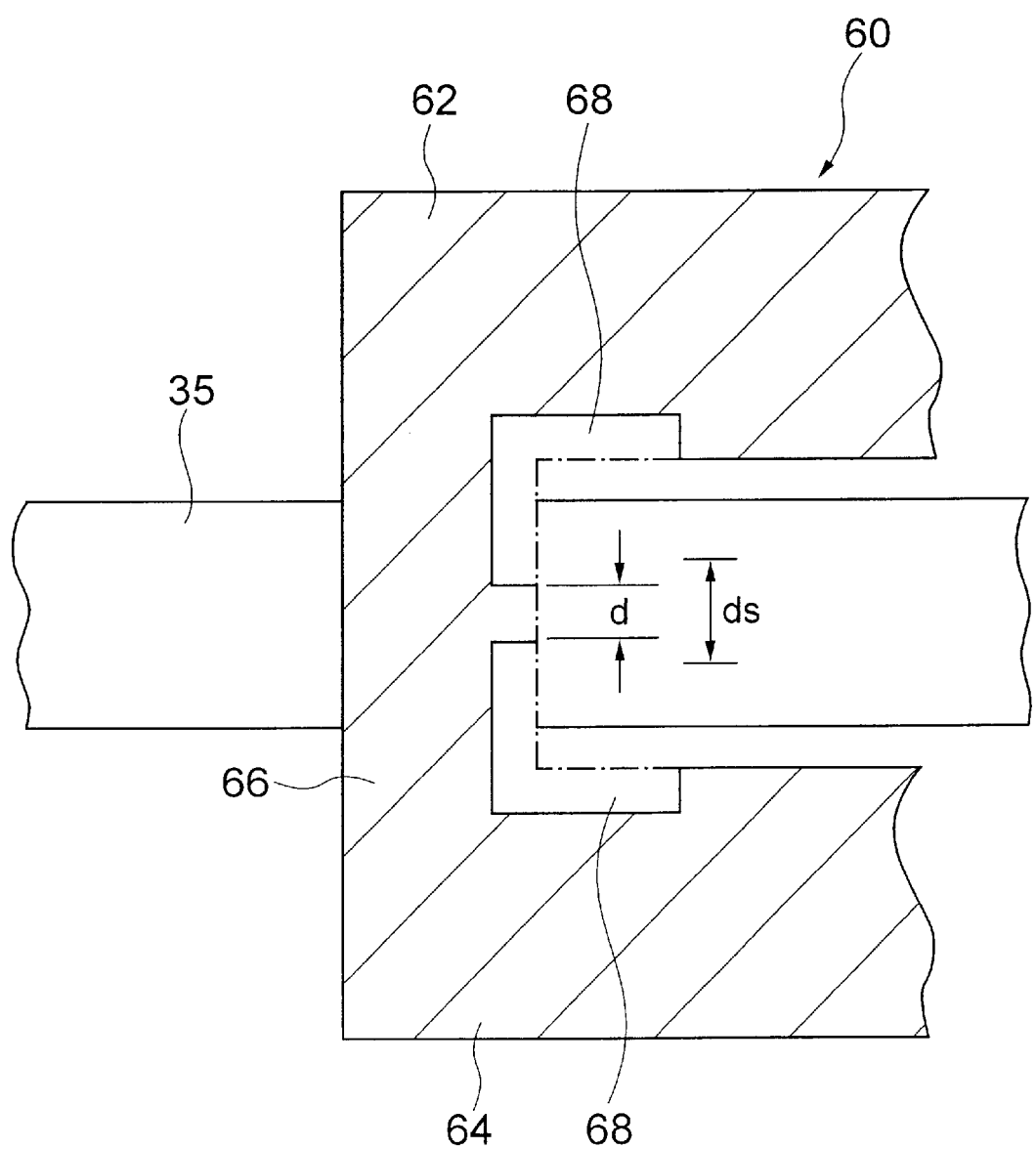
FIG. 11 shows a first type "]"-shaped pattern provided with default cutout correction patterns based on the method of FIG. 10.
Figure 12:
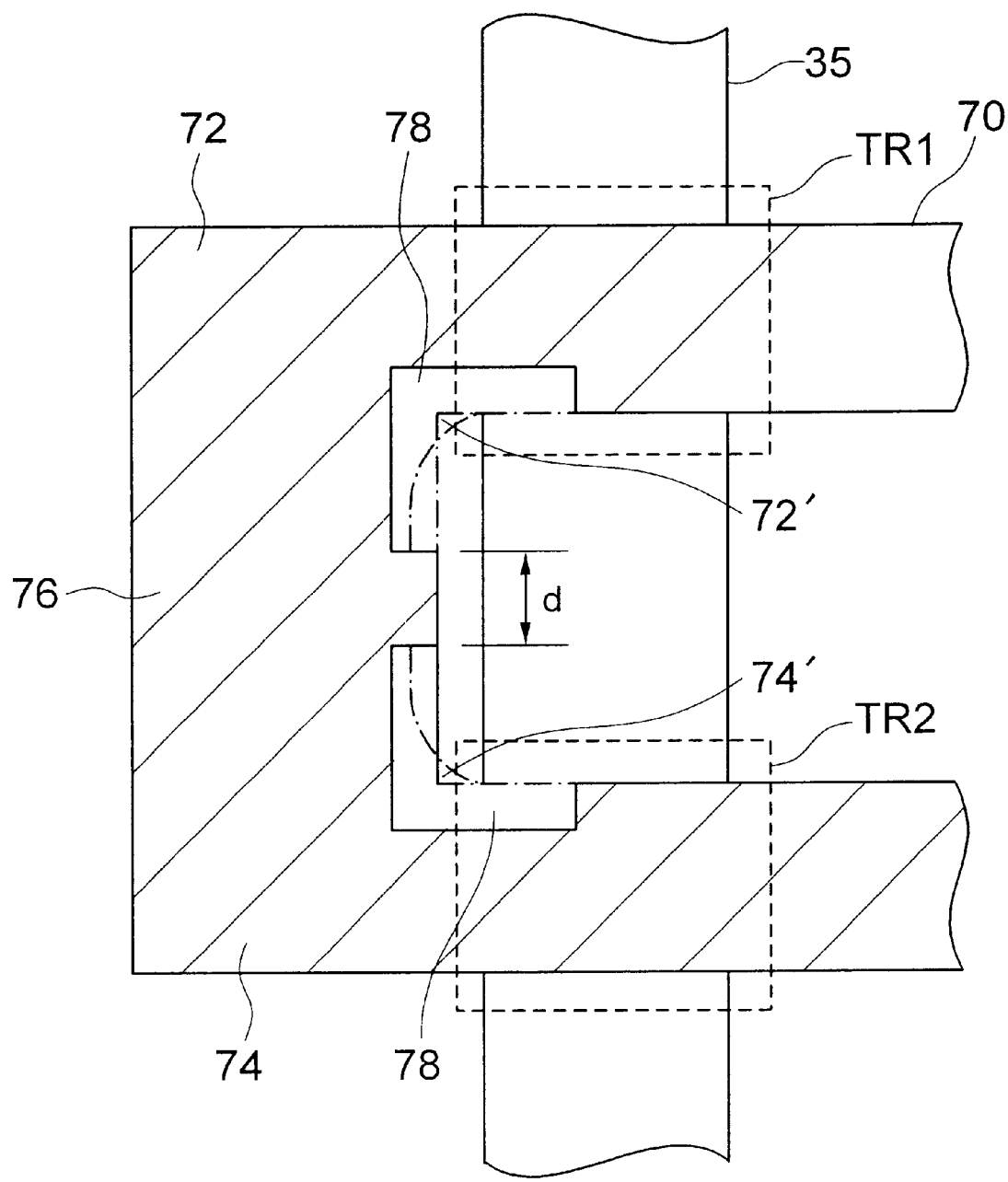
FIG. 12 shows a second type "]"-shaped pattern provided with default cutout correction patterns based on the method of FIG. 10.
Figure 13:
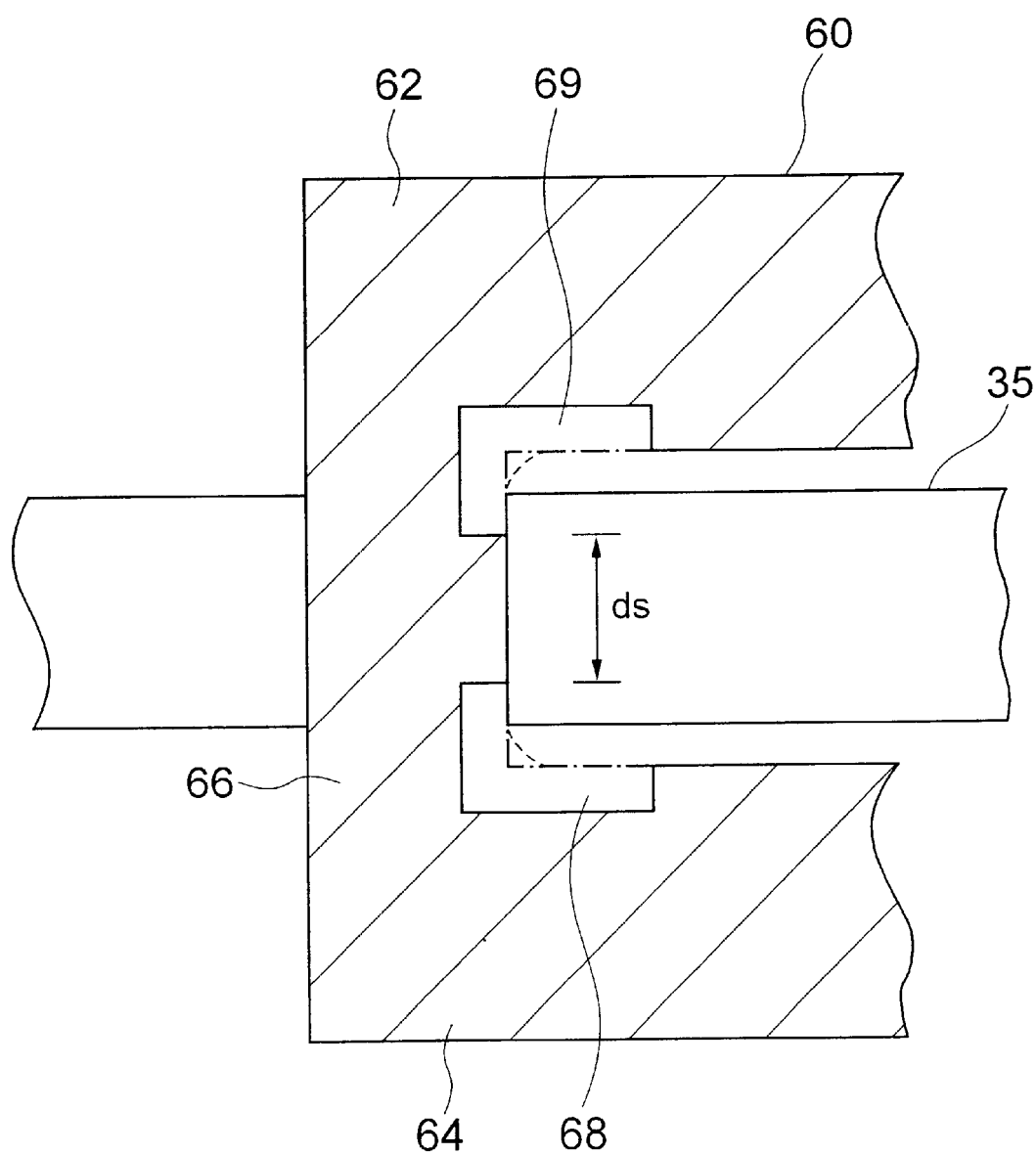
FIG. 13 is the first type "]"-shaped pattern provided with modified cutout correction patterns based on the method of FIG. 10.

The embodiment described below is an exemplary embodiment of an optical proximity effect correction method according to the second method of the present invention. FIG. 10 is a flowchart illustrating the procedure of performing the optical proximity effect correction method of the present embodiment, FIG. 11 is a pattern diagram illustrating a default cutout correction pattern provided on an inner corner of each corner portion in a first type "]"-shaped pattern, FIG. 12 is a pattern diagram illustrating the a cutout correction pattern provided in the inner corner of each corner portion of a second "]"-shaped pattern, and FIG. 13 is a pattern diagram illustrating a modified cutout correction pattern provided in the inner corner of the each corner portion of the first "]"-shaped pattern.

The method of the present embodiment is used to correct a mask interconnect pattern in which a straight portion or a pattern portion extending from a corner portion of the "]"-shaped pattern extends across a diffused region to implement a gate electrode.

With reference to FIG. 10, the procedure of the method of the present embodiment will be described. First, in step 1, the design interconnect pattern 22 as illustrated in FIG. 4 is scanned to extract L-shaped patterns, and the process advances to step 2. In the design interconnect pattern 22 of FIG. 4, reference numerals 24 to 29 denote corner portions forming L-shaped patterns of the present embodiment.

In step 2, on the inner corner (corner having a bend angle of 270°) of each of the corner portions or L-shaped patterns of a mask interconnect pattern, a default cutout correction pattern is equally provided to each inner corner based on the L-shaped pattern optical proximity effect correction rule, and the process advances to step 3.

For example, as illustrated in FIG. 11, for a mask interconnect pattern 60 corresponding to the corner portions 24 and 25 forming L-shaped patterns of the design interconnect pattern 22, a cutout correction pattern 68 is equally provided based on the L-shaped pattern optical proximity effect correction rule on the inner corner of each of the corner portions 62 and 64, and the process advances to step 3. A straight portion 66 of the mask interconnect pattern 60 corresponds to the straight portion 32 of the design interconnect pattern 22 in FIG. 4.

For a mask interconnect pattern 70 corresponding to the corner portions 27 and 28 forming L-shaped patterns of the design interconnect pattern 22, a cutout correction pattern 78, as illustrated in FIG. 12, is equally provided based on the L-shaped pattern optical proximity effect correction rule on the inner corner of each of the corner portions 72 and 74, and the process advances to step 4.

In FIG. 12, the straight portion extending rightward from the corner portion 72 implements a gate electrode for a transistor TR1, and the straight portion extending rightward from the corner portion 74 implements a gate electrode for a transistor TR2, the transistors TR1 and TR2 constituting parallel transistors.

A straight portion 76 of the mask interconnect pattern 70 corresponds to the straight portion 33 of the design interconnect pattern 22.

In step 3, it is determined whether or not two adjacent ones of the L-shaped patterns, which have been extracted in step 1, in combination form a "]"-shaped pattern. If yes, the process advances to step 4 and, otherwise, to step 8.

The "]"-shaped pattern refers to, for example, an interconnect pattern including the corner portions 24 and 25 and the straight portion 32 of FIG. 4, or an interconnect pattern including the corner portions 27 and 28 and the straight portion 33 of FIG. 4.

In step 4, it is determined whether the extracted "]"-shaped pattern is a first type "]"-shaped pattern in which the straight portion extends across a diffused region to form a gate electrode or a second type "]"-shaped pattern in which the straight portion extends along a diffused region at a predetermined distance or more away from the diffused region while the respective pattern portions extending from the corner portions extend across the diffused region to implement the gate electrodes of the parallel transistors. If the extracted "]"-shaped pattern is the first type "]"-shaped pattern, the process advances to step 5, and if the extracted "]"-shaped pattern is the second type "]"-shaped pattern, the process advances to step 8.

If there is any "]"-shaped pattern which is neither the first type nor second type "]"-shaped pattern, the method described above in Embodiment 1 is applied thereto.

In step 5, the interval "d" measured along the straight portion 66 between the opposing ends of the legs of the default cutout correction patterns 68 which are respectively provided in the two adjacent corner portions 62 and 64 of the mask interconnect pattern 60 is calculated, as illustrated in FIG. 11, and the process advances to step 6.

In step 6, the calculated interval "d" between the opposing ends is compared against the predetermined setting interval $d_S$ (see FIG. 11). If the calculated interval "d" between the opposing ends is less than the predetermined setting interval $d_S$ as illustrated in FIG. 11, the process advances to step 7. If the calculated interval "d" between the opposing ends is equal to or greater than the setting interval "$d_S$", the process advances to step 8.

In step 7, a modified cutout correction pattern 69, which is obtained by shortening the length of the leg of the L-shaped correction pattern along the straight portion 66 of the cutout correction patterns 68 so that the interval "d" between the opposing ends of the modified cutout correction patterns is equal to the setting interval $d_S$, is provided on the inner corner of each of the two corner portions 62 and 64 of the mask interconnect pattern 60, as illustrated in FIG. 13.

In this way, the dimensions of the straight portion 66 which implements a gate electrode are equal to the intended values as indicated by a broken line in FIG. 13, thereby providing a gate electrode having a desirable shape. Therefore, it is possible to obtain desired transistor characteristics.

In step 8, the default cutout correction pattern 68 or 78 provided in step 2 is used as the final cutout correction pattern.

If the extracted pattern is of the second type, even if the width of the straight portion 76 is reduced, there is substantially no influence on the characteristics of the two parallel transistors TR1 and TR2 illustrated in FIG. 13 because the straight portion 76 is not a gate electrode section. For the second type pattern, as with the first type pattern, the dimension "d" can be compared against the setting "$d_S$" and, if it is less than "$d_S$", the dimension "d" is adjusted to "$d_S$" by shortening the legs of the default cutout correction patterns.

On the other hand, for the second type pattern, the transistor characteristics are not affected significantly. In this case, the interval "d" can either be adjusted to $d_S$ for reasons as previously discussed above with respect to the first type pattern, or not adjusted to $d_S$. However, it is noted that if it is to be adjusted to $d_S$, it takes a more processing time to perform the series of processes.

According to the method of the present invention, when transferring a mask interconnect pattern by photolithography, the interval between the opposing ends of the legs of both the cutout correction patterns which are provided in adjacent corner portions of a "]"-shaped pattern is maintained at a setting interval. Thus, the present invention realizes an optical proximity effect correction method in which a mask interconnect pattern is transferred onto a photoresist film substantially without reducing the width of a straight portion of the "]"-shaped pattern.

Since the above embodiments are described only for examples, the present invention is not limited to the above embodiments and various modifications or alterations can be easily made therefrom by those skilled in the art without departing from the scope of the present invention.

What is claimed is:

1. A method for correcting an optical proximity effect in a photolithographic process for patterning an interconnect pattern by using a mask pattern having a mask interconnect pattern, said method comprising:

extracting corner portions in said mask interconnect pattern;

providing a default cutout correction pattern having an "L"-shape on an inner corner of each of said extracted corner portions;

calculating a first distance between opposing ends of legs of adjacent two of said default cutout correction patterns;

comparing the first distance against a threshold distance; and modifying said default cutout correction patterns to obtain modified cutout patterns if said first distance is smaller than said threshold distance so that a distance between opposing ends of legs of said modified cutout patterns is substantially equal to said threshold distance.

2. The method as defined in claim 1 further comprising:

judging whether a portion of an interconnect corresponding to each of said extracted corner portions is to be in direct contact with a contact hole to thereby extract a selected corner portion in said mask pattern, and adding additional correction pattern on an outer corner of said selected corner portion.

3. The method as defined in claim 1, wherein said "L"-shaped pattern includes a gate electrode pattern between adjacent corner portions.

4. The method as defined in claim 1, wherein said calculating first distance comprises:

judging whether adjacent two of said extracted corner portions form a "]"-shaped pattern; and calculating said first distance between opposing ends of legs of adjacent two of said default cutout correction patterns in said "]"-shaped pattern.

5. The method as defined in claim 4, further comprising:

judging whether said "]"-shaped pattern comprises a first type or a second type, wherein said modifying said default cutout correction patterns is only performed on said first type.

6. A method for correcting an optical proximity effect in a photolithographic process for patterning an interconnect pattern by using a mask pattern having a mask interconnect pattern, said method comprising:

extracting corner portions in said mask interconnect pattern;

providing a default cutout correction pattern having a predetermined shape on an inner corner of each of said extracted corner portions;

calculating a first distance between opposing ends of legs of adjacent ones of said default cutout correction patterns;

comparing the first distance against a threshold distance; and modifying said default cutout correction patterns to obtain modified cutout patterns.

7. The method as defined in claim 6, wherein said modifying is performed when said first distance is smaller than said threshold distance.

8. The method as defined in claim 6, wherein said modifying is performed so that a distance between opposing ends of legs of said modified cutout patterns is substantially equal to said threshold distance.

9. The method as defined in claim 6 further comprising:

judging whether a portion of an interconnect corresponding to each of said extracted corner portions is to be in direct contact with a contact hole to thereby extract a selected corner portion in said mask pattern; and adding additional correction pattern on an outer corner of said selected corner portion.

10. The method as defined in claim 6, wherein said calculating said first distance comprises:

judging whether adjacent two of said extracted corner portions form a second predetermined shape pattern.

11. The method as defined in claim 10, wherein said calculating said first distance further comprises:

calculating said first distance between opposing ends of legs of adjacent two of said default cutout correction patterns in said second predetermined shape pattern.

12. The method as defined in claim 10, wherein said second predetermined shape pattern includes a gate electrode pattern between adjacent corner portions.

13. The method as defined in claim 10 further comprising:
judging whether said second predetermined shape pattern comprises one of a first type and a second type.

14. The method as defined in claim 13, wherein said modifying said default cutout correction patterns is only performed on said first type.

15. The method as defined in claim 13, wherein said first type comprises a straight portion of the second predetermined shape pattern which implements the gate electrode of a MOS transistor having source and drain regions in a diffused region.

16. The method as defined in claim 13, wherein said second type comprises a straight portion of the interconnect pattern extending parallel to a diffused region for a MOS transistor over a predetermined distance with a predetermined gap therebetween and a pair of straight lines extending from the corner portions extend across the diffused region to implement a pair of gate electrodes of transistors.

* * * * *